United States Patent
Fan et al.

(10) Patent No.: US 10,484,009 B2
(45) Date of Patent: Nov. 19, 2019

(54) DECODING METHOD AND DECODER FOR LOW-DENSITY PARITY-CHECK CODE

(71) Applicant: Huawei Technologies Co., Ltd., Shenzhen (CN)

(72) Inventors: Jiaqi Fan, Shenzhen (CN); Xiaoshu Si, Wuhan (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/982,503

(22) Filed: May 17, 2018

(65) Prior Publication Data
US 2018/0269900 A1 Sep. 20, 2018

Related U.S. Application Data

(63) Continuation of application No. PCT/CN2015/094783, filed on Nov. 17, 2015.

(51) Int. Cl.
*H03M 13/11* (2006.01)
*H03M 13/00* (2006.01)
*H04L 1/00* (2006.01)

(52) U.S. Cl.
CPC ........ *H03M 13/112* (2013.01); *H03M 13/116* (2013.01); *H03M 13/1137* (2013.01);
(Continued)

(58) Field of Classification Search
None
See application file for complete search history.

(56) References Cited

U.S. PATENT DOCUMENTS

2005/0289437 A1 12/2005 Oh et al.
2009/0183047 A1* 7/2009 Lampe ................ H03M 13/033
714/752

(Continued)

FOREIGN PATENT DOCUMENTS

CN 101820288 A 9/2010
CN 102638275 A 8/2012
(Continued)

OTHER PUBLICATIONS

Data-Over-Cable Service Interface Specifications. DOCSIS® 3.1, Physical Layer Specification, CM-SP-PHYv3.1-I01-131029, 2013, 220 pages.
(Continued)

*Primary Examiner* — Justin R Knapp
(74) *Attorney, Agent, or Firm* — Conley Rose, P.C.

(57) ABSTRACT

A decoding method and a decoder for a low-density parity-check (LDPC) code, where the method includes dividing, by a decoder, an LDPC code C whose bit length is n into k LDPC codes $D=\{D_1,D_2,K,D_{k-1},D_k\}$, arranging, by the decoder, $D_i$, i=1,2,K,k−1,k by column to obtain transpose codes $D^T=\{D_1^T,D_2^T,K,D_{k-1}^T,D_k^T\}$ of the LDPC codes D, performing cyclic shift on $D_i^T$, i=1,2,K,k−1,k by row according to values of corresponding elements in a target check matrix to obtain shift codes $E=\{E_1,E_2,K,E_{t-1},E_t\}$, where t is equal to a quantity of rows of the target check matrix, obtaining, by the decoder, t*m groups of LDPC subcodes $F_1,F_2,K,F_{tm-1},F_{tm}$ according to the shift codes E and a bit length d of the decoder, where $E_j$ is divided into m groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, and m=⌈l/d⌉, and decoding, by the decoder, the m groups of LDPC subcodes to obtain a decoding result of the LDPC code C.

18 Claims, 9 Drawing Sheets

(52) U.S. Cl.
CPC .......... *H03M 13/6508* (2013.01); *H04L 1/00* (2013.01); *H03M 13/1117* (2013.01)

(56) References Cited

U.S. PATENT DOCUMENTS

| | | | |
|---|---|---|---|
| 2010/0107030 A1 | 4/2010 | Graef | |
| 2011/0126078 A1 | 5/2011 | Ueng et al. | |
| 2011/0239080 A1 | 9/2011 | Sakaue et al. | |
| 2012/0089884 A1* | 4/2012 | Kamiya | H03M 13/1111 714/752 |
| 2013/0086456 A1* | 4/2013 | Yedidia | H03M 13/036 714/781 |
| 2014/0317477 A1 | 10/2014 | Chang et al. | |

FOREIGN PATENT DOCUMENTS

| | | |
|---|---|---|
| CN | 102687445 A | 9/2012 |
| EP | 2088679 A2 | 8/2009 |

OTHER PUBLICATIONS

IEEE Std 802.16e™-2005 and IEEE Std 802.16™-2004/Cor1-2005, "IEEE Standard for Local and metropolitan area networks Part 16: Air Interface for Fixed and Mobile Broadband Wireless Access Systems Amendment 2: Physical and Medium Access Control Layers for Combined Fixed and Mobile Operation in Licensed Bands and Corrigendum 1," IEEE Computer Society and the IEEE Microwave Theory and Techniques Society, Sponsored by the LAN/MAN Standards Committee, Feb. 28, 2006, 864 pages.

Eriz, M., et al., "DVB-S2 Low Density Parity Check Codes with Near Shannon Limit Performance," International journal of satellite communications and networking, Jun. 16, 2004, 11 pages.

ETSI EN 302 769 V1.1.1, "Digital Video Broadcasting (DVB); Frame structure channel coding and modulation for a second generation digital transmission system for cable systems (DVB-C2)," European Standard (Telecommunications series), Apr. 2010, 110 pages.

Machine Translation and Abstract of Chinese Publication No. CN101820288, Sep. 1, 2010, 8 pages.

Foreign Communication From a Counterpart Application, PCT Application No. PCT/CN2015/094783, English Translation of International Search Report dated Aug. 8, 2016, 3 pages.

Foreign Communication From A Counterpart Application, PCT Application No. PCT/CN2015/094783, English Translation of Written Opinion dated Aug. 8, 2016, 6 pages.

Kim, B., et al., "Area-Efficient QC-LDPC Decoder Architecture Based on Stride Scheduling and Memory Bank Division," IEICE Transactions on Communications, vol. E96-B, No. 7, XP001585320, Jul. 2013, pp. 1772-1779.

Foreign Communication From a Counterpart Application, European Application No. 15908521.6, Extended European Search Report dated Sep. 25, 2018, 9 pages.

* cited by examiner

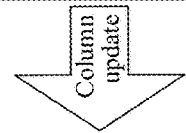
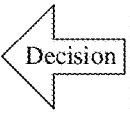
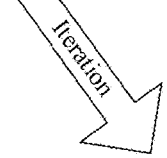
FIG. 2A
FIG. 2B
FIG. 2C
FIG. 2D
FIG. 2E
FIG. 2F

| 3 | 1 | 4 | 2 | 4 | 2 | 6 | -1 | -1 | -1 |
|---|---|---|---|---|---|---|----|----|----|
| 2 | 0 | 4 | 4 | 1 | 5 | 4 | 3  | -1 | -1 |
| 1 | 3 | 5 | 2 | 5 | 4 | -1 | 2 | 7  | -1 |
| 7 | 6 | 3 | 5 | 7 | 2 | -1 | -1 | 2 | 5  |

FIG. 3

| 1 | 0 | 0 | 0 | 0 | 0 | 0 | 0 |
|---|---|---|---|---|---|---|---|
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 | k=0

| 0 | 1 | 0 | 0 | 0 | 0 | 0 | 0 |
|---|---|---|---|---|---|---|---|
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 | k=1

| 0 | 0 | 1 | 0 | 0 | 0 | 0 | 0 |
|---|---|---|---|---|---|---|---|
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 |
| 0 | 1 | 0 | 0 | 0 | 0 | 0 | 0 | k=2

FIG. 4

| a1 | a9 | a17 | a25 | a33 | a41 | a49 | a57 | a65 | a73 |
|----|----|----|----|----|----|----|----|----|----|
| a2 | a10 | a18 | a26 | a34 | a42 | a50 | a58 | a66 | a74 |
| a3 | a11 | a19 | a27 | a35 | a43 | a51 | a59 | a67 | a75 |
| a4 | a12 | a20 | a28 | a36 | a44 | a52 | a60 | a68 | a76 |
| a5 | a13 | a21 | a29 | a37 | a45 | a53 | a61 | a69 | a77 |
| a6 | a14 | a22 | a30 | a38 | a46 | a54 | a62 | a70 | a78 |
| a7 | a15 | a23 | a31 | a39 | a47 | a55 | a63 | a71 | a79 |
| a8 | a16 | a24 | a32 | a40 | a48 | a56 | a64 | a72 | a80 |

FIG. 7

| | | | | | | | | | |
|---|---|---|---|---|---|---|---|---|---|
| a4 | a10 | a21 | a27 | a37 | a43 | a55 | 0 | 0 | 0 |
| a5 | a11 | a22 | a28 | a38 | a44 | a56 | 0 | 0 | 0 |
| a6 | a12 | a23 | a29 | a39 | a45 | a49 | 0 | 0 | 0 |
| a7 | a13 | a24 | a30 | a40 | a46 | a50 | 0 | 0 | 0 |
| a8 | a14 | a17 | a31 | a33 | a47 | a51 | 0 | 0 | 0 |
| a1 | a15 | a18 | a32 | a34 | a48 | a52 | 0 | 0 | 0 |
| a2 | a16 | a19 | a25 | a35 | a41 | a53 | 0 | 0 | 0 |
| a3 | a9 | a20 | a26 | a36 | a42 | a54 | 0 | 0 | 0 |
| a3 | a9 | a21 | a29 | a34 | a46 | a53 | a60 | 0 | 0 |
| a4 | a10 | a22 | a30 | a35 | a47 | a54 | a61 | 0 | 0 |
| a5 | a11 | a23 | a31 | a36 | a48 | a55 | a62 | 0 | 0 |
| a6 | a12 | a24 | a32 | a37 | a41 | a56 | a63 | 0 | 0 |
| a7 | a13 | a17 | a25 | a38 | a42 | a49 | a64 | 0 | 0 |
| a8 | a14 | a18 | a26 | a39 | a43 | a50 | a57 | 0 | 0 |
| a1 | a15 | a19 | a27 | a40 | a44 | a51 | a58 | 0 | 0 |
| a2 | a16 | a20 | a28 | a33 | a45 | a52 | a59 | 0 | 0 |
| a2 | a12 | a22 | a27 | a38 | a45 | 0 | a59 | a72 | 0 |
| a3 | a13 | a23 | a28 | a39 | a46 | 0 | a60 | a65 | 0 |
| a4 | a14 | a24 | a29 | a40 | a47 | 0 | a61 | a66 | 0 |
| a5 | a15 | a17 | a30 | a33 | a48 | 0 | a62 | a67 | 0 |
| a6 | a16 | a18 | a31 | a34 | a41 | 0 | a63 | a68 | 0 |
| a7 | a9 | a19 | a32 | a35 | a42 | 0 | a64 | a69 | 0 |
| a8 | a10 | a20 | a25 | a36 | a43 | 0 | a57 | a70 | 0 |
| a1 | a11 | a21 | a26 | a37 | a44 | 0 | a58 | a71 | 0 |
| a8 | a15 | a20 | a30 | a40 | a43 | 0 | 0 | a67 | a78 |
| a1 | a16 | a21 | a31 | a33 | a44 | 0 | 0 | a68 | a79 |
| a2 | a9 | a22 | a32 | a34 | a45 | 0 | 0 | a69 | a80 |
| a3 | a10 | a23 | a25 | a35 | a46 | 0 | 0 | a70 | a73 |
| a4 | a11 | a24 | a26 | a36 | a47 | 0 | 0 | a71 | a74 |
| a5 | a12 | a17 | a27 | a37 | a48 | 0 | 0 | a72 | a75 |
| a6 | a13 | a18 | a28 | a38 | a41 | 0 | 0 | a65 | a76 |
| a7 | a14 | a19 | a29 | a39 | a42 | 0 | 0 | a66 | a77 |

Groups: $F_1$, $F_2$, $F_3$, $F_4$, $F_5$, $F_6$, $F_7$, $F_8$

DECODING METHOD AND DECODER FOR LOW-DENSITY PARITY-CHECK CODE

CROSS-REFERENCE TO RELATED APPLICATIONS

This application is a continuation of International Patent Application No. PCT/CN2015/094783 filed on Nov. 17, 2015, which is hereby incorporated by reference in its entirety.

TECHNICAL FIELD

Embodiments of the present disclosure relate to the encoding and decoding field, and in particular, to a decoding method and a decoder for a low-density parity-check code (LDPC).

BACKGROUND

An LDPC is a packet error correcting code with a sparse check matrix, and is applicable to almost all channels. Performance of the LDPC code approaches the Shannon limit, and the LDPC code is characterized by being easy to describe and implement, easy for theoretical analysis and research, easy to decode with support for parallel operations, and suitable for hardware implementation. Therefore, in recent years, the LDPC code has become a hot research subject in the communications field.

LDPC codes have various bit lengths. For example, the Data Over Cable Service Interface Specification (DOCSIS) 3.1 protocol specifies three bit lengths, where a bit length of a long code is L=360, a bit length of a medium code is L=180, and a bit length of a short code is L=56. Generally, a decoder needs to support multiple bit lengths. For example, an LDPC decoder needs to support all the three LDPC bit lengths, including the long-code, medium-code, and short-code bit lengths. Currently, an LDPC decoder is designed in compliance with the maximum bit length. For example, an LDPC decoder of the bit length of 360 is used to decode LDPC codes of all bit lengths (56, 180, and 360). When an LDPC decoder of such design decodes LDPC codes of different bit lengths, different quantities of processing units are used for computation, and therefore, quantities of parallel operations supported are different, resulting in different processing performance. For example, for long codes, the processing performance is high but many resources are used, which causes difficulty in timing. For short codes, a quantity of parallel operations supported is relatively small such that the processing performance is too low to meet a traffic requirement.

SUMMARY

Embodiments of the present disclosure provide a decoding method and a decoder for an LDPC code such that a quantity of parallel decoding operations on an LDPC code can be controlled flexibly.

According to a first aspect, a decoding method for an LDPC code is provided. The method is executed by a decoder whose bit length is d.

First, the decoder performs a segmentation operation, that is, the decoder divides an LDPC code $C=\{c_1,c_2,c_3,K,c_{n-1},c_n\}$ whose bit length is n into k LDPC codes $D=\{D_1, D_2, K, D_{k-1}, D_k\}$, where $D_i=\{c_{(i-1)l+1},c_{(i-1)l+2},K,c_{il-1},c_{il}\}$, $i=1, 2, K, k-1, k$, and a bit length of $D_i$ is $l=n/k$.

Next, the decoder performs a transpose operation, that is, arranging $D_j$, $i=1, 2, K, k-1, k$ by column to obtain transpose codes $D^T=\{D_1^T,D_2^T,K,D_{k-1}^T,D_k^T\}$ of the LDPC codes D, where $D_i^T=\{c_{(i-1)l+1},c_{(i-1)l+2},K,c_{il-1}, c_{il}\}^T$, $i=1, 2, K, k-1, k$.

Then, the decoder performs a rotation operation (or referred to as a cyclic shift operation), that is, performing cyclic shift on $D_i^T$, $i=1, 2, K, k-1, k$ by row according to values of corresponding elements in a target check matrix to obtain shift codes $E=\{E_1,E_2,K,E_{t-1},E_t\}$, where t is equal to a quantity of rows of the target check matrix, and is a result of shifting $D^T$ according to an element of the $j^{th}$ row in the target check matrix, where $j=1, 2, K, t-1, t$.

Then, the decoder performs a grouping operation, that is, dividing the shift codes into groups according to a bit length of the decoder. Further, the decoder obtains t*m groups of LDPC subcodes $F_1,F_2,K,F_{tm-1}$, F according to the shift codes E and the bit length d of the decoder, where $E_j$ is divided into groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, $(E_j)_{(s-1)d+1}^{sd}$, $s=1, 2, K, m-1$, m denotes the $[(s-1)d+1]^{th}$ row to the $(sd)^{th}$ row of $E_j$, $m=\lceil l/d \rceil$ and $\lceil \; \rceil$ denotes a roundup operation.

Finally, the decoder decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d in order to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

The foregoing segmentation operation, transpose operation, and cyclic shift operation that are performed by the decoder may be similar to existing corresponding operations. Therefore, detailed descriptions are not provided in this embodiment of the present disclosure.

With reference to the first aspect, in a first implementation manner of the first aspect, when the decoder decodes the m groups of LDPC subcodes to obtain the decoding result of the LDPC code C, the decoder may obtain log likelihood ratio (LLR) values $G_1,G_2,K,G_{tm-1},G_{tm}$ corresponding to the LDPC subcodes. Then, the decoder may update check nodes according to the LLR values in an order of $r=1, 2, K, tm-1$, tm to obtain a row-updated matrix. Then, the decoder may update variable nodes column by column according to the row-updated matrix to obtain a column-updated matrix. Finally, the decoder may perform decision and checking on the column-updated matrix to obtain the decoding result of the LDPC code C.

In this way, the decoder in this embodiment of the present disclosure may perform, in a row-update process, a row-update operation on each group of LDPC subcodes, thereby implementing a process in which an LDPC code with a larger bit length is decoded using a decoder with a smaller bit length.

With reference to any one of the first aspect or the foregoing implementation manner thereof, in a second implementation manner of the first aspect, the LDPC code C is a quasi-cyclic LDPC (QC-LDPC), and l is an inflation factor of the QC-LDPC code.

Segmenting the QC-LDPC code according to a magnitude of the inflation factor of the QC-LDPC code enables flexible control on a quantity of parallel decoding operations and enables convenient decoding. Therefore, decoding complexity is lowered.

With reference to any one of the first aspect or the foregoing implementation manners thereof, in a third implementation manner of the first aspect, d is 60 or 180.

With reference to any one of the first aspect or the foregoing implementation manners thereof, in a fourth implementation manner of the first aspect, when the decoder decodes the m groups of LDPC subcodes to obtain the decoding result of the LDPC code C, the decoder may use a minimum sum (Min-sum) decoding algorithm to decode the m groups of LDPC subcodes to obtain the decoding result of the LDPC code C.

According to a second aspect, a decoder for an LDPC code is provided. A bit length of the decoder is d. The decoder includes a segmentation unit, an arrangement unit, a shift unit, a grouping unit, and a decoding unit.

The segmentation unit performs a segmentation operation, that is, dividing an LDPC code $C=\{c_1,c_2,c_3,K,c_{n-1},c_n\}$ whose bit length is n into k LDPC codes $D=\{D_1,D_2,K,D_{k-1},D_k\}$, where $D_i=\{c_{(i-1)l+1},c_{(i-1)l+2},K,c_{il-1},c_{il}\}$, $i=1, 2, K, k-1, k$, and a bit length of $D_i$ is $l=n/k$.

The arrangement unit performs a transpose operation, that is, arranging $D_i$, $i=1, 2, K, k-1, k$ by column to obtain transpose codes $D^T=\{D_1^T,D_2^T,K,D_{k-1}^T,D_{k-1}^T\}$ of the LDPC codes D, where $D_i^T=\{c_{(i-1)l+1},c_{(i-1)l+2},K,c_{il-1},c_{il}\}^T$, $i=1, 2, K, k-1, k$.

The shift unit performs a rotation operation (or referred to as a cyclic shift operation), that is, performing cyclic shift on $D_i^T$, $i=1, 2, K, k-1, k$ by row according to values of corresponding elements in a target check matrix to obtain shift codes $E=\{E_1,E_2,K,E_{t-1},E_t\}$ where t is equal to a quantity of rows of the target check matrix, and $E_j$ is a result of shifting $D^T$ according to an element of the $j^{th}$ row in the target check matrix, where $j=1, 2, K, t-1, t$.

The grouping unit performs a grouping operation, that is, dividing the shift codes into groups according to a bit length of the decoder. Further, the grouping unit obtains t*m groups of LDPC subcodes $F_1, F_2, K, F_{tm-1}, F_{tm}$ according to the shift codes E and the bit length of the decoder, where $E_j$ is divided into groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, $(E_j)_{(s-1)d+1}^{sd}$, $s=1, 2, K, m-1, m$ denotes the $[(s-1)d+1]^{th}$ row to the $(sd)^{th}$ row of $E_j$, $m=\lceil l/d \rceil$.

The decoding unit decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

For further information about the units of the decoder in the second aspect, reference may be made to the corresponding steps of the method in the first aspect, which are not repeated herein.

According to a third aspect, a decoding method for an LDPC code is provided. The method is executed by a decoder whose bit length is d.

First, the decoder performs a segmentation operation, that is, the decoder divides an LDPC code $C=\{c_1,c_2,c_3,K,c_{n-1},c_n\}$ whose bit length is n into k LDPC codes $D=\{D_1,D_2,K,D_{k-1},D_k\}$, where $D_i=\{c_{(i-1)l+1},c_{(i-1)l+2},K,c_{il-1},c_{il}\}$, $i=1, 2, K, k-1, k$, and a bit length of $D_i$ is $l=n/k$.

Then, the decoder obtains LLR values $G=\{G_1,G_2,K,G_{k-1},G_k\}$ corresponding to the LDPC codes D, and initializes a target check matrix according to the LLR values to obtain an initialized check matrix $E=\{E_1,E_2,K,E_{t-1},E_t\}$, where t is equal to a quantity of rows of the target check matrix.

Next, the decoder performs a grouping operation, that is, dividing the initialized check matrix into groups according to a bit length of the decoder. Further, the decoder obtains t*m groups of LDPC subcodes $F_1, F_2, F_{tm-1}, F_{tm}$ according to an initialized code and the bit length d of the decoder, where $E_j$, $j=1, 2, K, t-1,t$ is divided into m groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, $(E_j)_{(s-1)d+1}^{sd}$, $s=1, 2, K, m-1, m$ denotes the $[(s-1)d+1]^{th}$ row to the $(sd)^{th}$ row of $E_j$, $m=\lceil l/d \rceil$, and $\lceil \ \rceil$ denotes a roundup operation.

Finally, the decoder decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

With reference to the third aspect, in a first implementation manner of the third aspect, when the decoder decodes the m groups of LDPC subcodes to obtain the decoding result of the LDPC code C, the decoder may update check nodes according to the m groups of LDPC subcodes in an order of r=1, 2, K, tm−1, tm to obtain a row-updated matrix. Then, the decoder may update variable nodes column by column according to the row-updated matrix to obtain a column-updated matrix. Finally, the decoder may perform decision and checking on the column-updated matrix to obtain the decoding result of the LDPC code C.

In this way, the decoder in this embodiment of the present disclosure may perform, in a row-update process, a row-update operation on each group of LDPC subcodes, thereby implementing a process in which an LDPC code with a larger bit length is decoded using a decoder with a smaller bit length.

It should be noted that this embodiment of the present disclosure is essentially the same as the embodiment of the first aspect. In the embodiment of the first aspect, after performing the transpose operation, the rotation operation, and the operation for obtaining LLR values, the decoder can obtain the initialized check matrix in this embodiment of the present disclosure, and then, may perform the same steps as in this embodiment of the present disclosure in order to obtain the decoding result of the LDPC code.

For further information about the steps of the method in the third aspect, reference may be made to the corresponding steps of the method in the first aspect, which are not repeated herein.

According to a fourth aspect, a decoder for an LDPC code is provided. A bit length of the decoder is d. The decoder includes a segmentation unit, an initialization unit, a grouping unit, and a decoding unit.

The segmentation unit performs a segmentation operation, that is, dividing an LDPC code $C=\{c_1,c_2,c_3,K,c_{n-1},c_n\}$ whose bit length is n into k LDPC codes $D=\{D_1,D_2,K,D_{k-1},D_k\}$, where $D_i=\{c_{(i-1)l+1},c_{(i-1)l+2},K,c_{il-1},c_{il}\}$, i=1, 2, K, k−1, k, and a bit length of $D_i$ is l=n/k.

The initialization unit obtains LLR values $G=\{G_1,G_2,K,G_{k-1},G_k\}$ corresponding to the LDPC codes D, and initializes a target check matrix according to the LLR value to obtain an initialized check matrix $E=\{E_1,E_2,K,E_{t-1},E_t\}$, where t is equal to a quantity of rows of the target check matrix.

The grouping unit performs a grouping operation, that is, dividing the initialized check matrix into groups according to a bit length of the decoder. Further, the decoder obtains t*m groups of LDPC subcodes $F_1$, $F_2$, $F_{tm-1}$, $F_{tm}$ according to an initialized code and the bit length d of the decoder, where $E_j$=1, 2, K, t−1, t is divided into m groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, $(E_j)_{(s-1)d+1}^{sd}$, s=1, 2, K, m−1, m denotes the $[(s-1)d+1]^{th}$ row to the $(sd)^{th}$ row of $E_j$, m=⌈l/d⌉, and ⌈ ⌉ denotes a roundup operation.

The decoding unit decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

For further information about the units of the decoder in the fourth aspect, reference may be made to the corresponding steps of the method in the third aspect, which are not repeated herein.

According to a fifth aspect, a communications device is provided. The communications device includes the decoder in the second aspect or the decoder in the fourth aspect.

The communications device in this embodiment of the present disclosure may include a plurality of the decoders, where bit lengths of these decoders may be the same or different. For example, a bit length of one or more decoders may be 60, and a bit length of one or more other decoders may be 180.

With multiple decoders included in the communications device, parallel decoding operations supported by the communications device are increased.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

FIGS. 2A, 2B, 2C, 2D, 2E and 2F are a schematic block diagram of a decoding method for an LDPC code;

FIG. 3 is a structural schematic block diagram of a base matrix of a QC-LDPC code according to an embodiment of the present disclosure;

FIG. 4 is a schematic block diagram of element matrix structures of a base matrix of a QC-LDPC code according to an embodiment of the present disclosure;

FIG. 7 is a schematic block diagram of a decoding method for an LDPC code according to another embodiment of the present disclosure;

FIG. 8 is a schematic block diagram of a decoding method for an LDPC code according to another embodiment of the present disclosure;

FIGS. 9A and 9B are a schematic block diagram of a decoding method for an LDPC code according to another embodiment of the present disclosure;

FIG. 10 is a schematic block diagram of a decoding method for an LDPC code according to an embodiment of the present disclosure;

DESCRIPTION OF EMBODIMENTS

Figure 1:
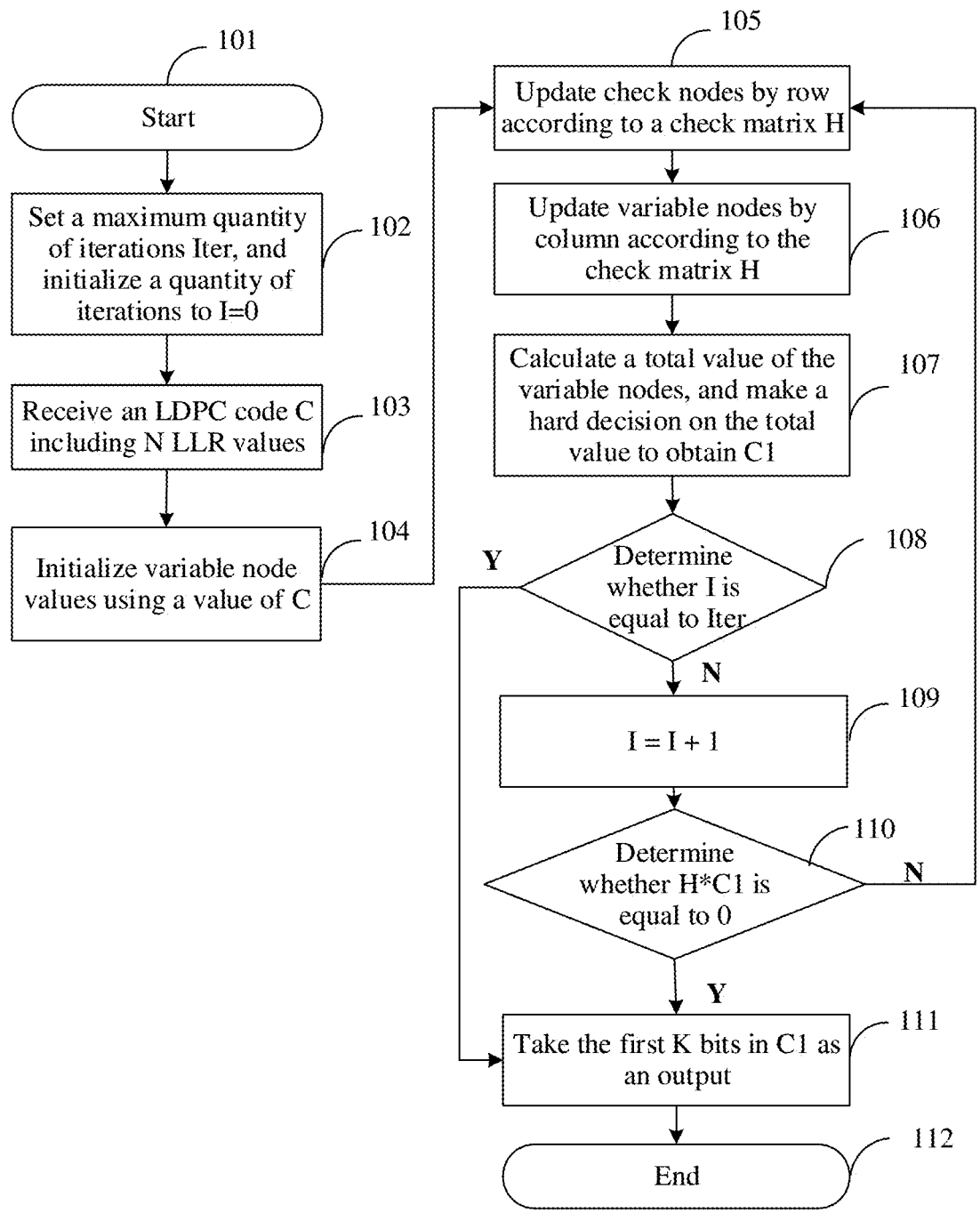
FIG. 1 is a schematic flowchart of a decoding method for an LDPC code.

The following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

LDPC decoding may be divided into two categories, hard decision decoding and soft decision decoding. A processing object of hard decision decoding is binary data, for which an amount of computation is small but decoding performance is quite limited. A processing object of soft decision decoding is an LLR value, for which an amount of computation is much larger but decoding performance is very high. In an actual application, the soft decision decoding manner is mainly used. Therefore, in the embodiments of the present disclosure, a method using soft decision decoding is mainly discussed.

Using a Min-sum decoding algorithm as an example, the following describes in detail a process based on the Min-sum decoding algorithm with reference to FIG. 1 and FIGS. 2A-2F.

Further, it is assumed that LDPC parameters are (N, K, P), where N denotes a codeword bit length, K denotes an information bit length, and P denotes a bit length of a check code generated after encoding. The following relationship exists: P=N−K. A check matrix H for a specific LDPC is unique, and dimensions of the check matrix H are P*N. In addition, H is a sparse matrix, and values of most elements of H are equal to 0 but only very few values are equal to 1.

It is assumed that the LDPC parameters are (7, 3, 4), where the bit length N=7, the information bit length K=3, the check code bit length P=N−K=4, and the dimensions of the check matrix H is 4*7.

Step 101: Start.

Step 102: Set a maximum quantity of iterations Iter, and initialize a quantity of iterations to I=0.

Further, for example, the maximum quantity of iterations may be 3, 5, and 10, or the like, and the quantity of iterations is initialized to I=0.

Step 103: Receive an LDPC code C including N LLR values, for example, soft information (that is, a codeword C) as shown in FIG. 2A:

APP=[c1 c2 c3 c4 c5 c6 c7].

As shown in FIG. 2A, the codeword C includes 7 LLR values, where $$LLR(r_i) = \log\left(\frac{P(r_i = 0)}{P(r_i = 1)}\right).$$

An LLR value is defined as a logarithm of a result of dividing a probability that a current bit $r_i$ is equal to 0 by a probability that the current bit $r_i$ is equal to 1.

Step 104: Initialize variable node values using a value of C.

Distribution of 1s in the check matrix H is shown in FIG. 2B. A dark-background square box represents 1, and a white-background square box represents 0. According to distribution positions of 1s in the matrix H, an APP value is used to initialize the variable node value $Lq_{ji}$, as shown in a formula (1), where i is a column index, j is a row index, $Lq_{ji}$ denotes a value of the $j^{th}$ row and the $i^{th}$ column of the check matrix, $Lc_i$=ci, and i∈[1,7].

$$Lq_{ji}=Lc_i \qquad (1)$$

For example, after initialization, values of all positions that are in the $i^{th}$ column and that are denoted by 1 are ci. For example, a value of the first column and the first row is c1, and a value of the fifth column and the third row is c5.

Step 105: Update check nodes by row according to the check matrix H.

As shown in FIG. 2C, the check nodes $Lr_{ji}$ are updated row by row. Sign bits of other check nodes of a current row excluding a current to-be-updated node are multiplied to be an output sign bit of the current node. A smallest value among absolute values of the other check nodes excluding the current node is used as an output absolute value of the current node. The updating goes on row by row until all 4 rows are updated. An update process is shown in a formula (2), where $R_{j/i}$ denotes a set of elements with a non-i column index in the $j^{th}$ row, $Lr_{ji}$ denotes a value of the $j^{th}$ row and the $i^{th}$ column of the row-updated check matrix, $$\prod_{R_{j/i}} \text{sign}(Lq_{ji})$$

denotes a sign bit of the $j^{th}$ row and the $i^{th}$ column that is obtained by multiplying sign bits of other check nodes of the $j^{th}$ row excluding the current to-be-updated node of the $j^{th}$ row and the $i^{th}$ column, and $$\min_{l \in R_{j/l}}(\beta_{jl})$$

denotes an absolute value of the current node that is obtained by taking a smallest value among absolute values of the other check nodes excluding the current node of the $j^{th}$ row and the $i^{th}$ column. In FIG. 2C, Sign*Min (*, *) is used to denote a result of the foregoing row-updating.

$$Lr_{ji} = \left(\prod_{R_{j/i}} \text{sign}(Lq_{ji})\right) * \min_{l \in R_{j/l}}(\beta_{jl}) \qquad (2)$$

$$B_{jl} = \|Lq_{jl}\| \qquad (3)$$

For example, after the row-updating, a value of the first row and the first column is Sign*Min (c3, c5), and a value of the second row and the second column is Sign*Min (c4, c6).

Step 106: Update variable nodes column by column according to the check matrix H.

As shown in FIG. 2D, the variable nodes $Lq_{ji}$ are updated column by column. A current to-be-updated node is excluded, and values of other variable nodes of a current column are added to obtain an updated value of the current node. An update process is shown in a formula (4), where $c_{j/i}$ denotes a set of elements with a non-j row index in the $i^{th}$ column, and $Lq_{ji}$ denotes a value of the $j^{th}$ row and the $i^{th}$ column of a column-updated check matrix. $\Sigma_{l \in C_{j/i}} Lr_{ji}$ denotes an updated value of the node of the $j^{th}$ row and the $i^{th}$ column that is obtained by adding values of other variable nodes of the $i^{th}$ column excluding the current node of the $j^{th}$ row and the $i^{th}$ column. It should be understood that in FIG. 2D, the first to the fourth rows are denoted using A, B, C, and D respectively, where a column is denoted by a numeral. For example, A1 denotes a value of a node of the first row and the first column after column updating, and C5 denotes a value of a node of the third row and the fifth column.

$$Lq_{ji} = \Sigma_{l \in C_{j/i}} Lr_{ji} \quad (4)$$

For example, after the column-updating, a value of the first row and the first column is A1=Sign*Min (c5, c7).

Step 107: Calculate a total value of variable nodes, and make a hard decision on the total value to obtain $c_1$.

A process of the hard decision is shown in FIG. 2E. Values of all variable nodes of each column are added, and then an original input LLR value at a corresponding position is further added to obtain a total value $LQ_i$ of the variable nodes, and decide the total value to be 1 or 0 according to sign bits of the variable nodes. Further, the decided value is determined according to the following formula:

$$LLR(r_i) = \log\left(\frac{P(r_i = 0)}{P(r_i = 1)}\right)$$
$$LLR(r_i) < 0 \quad r_i = 1$$
$$LLR(r_i) > 0 \quad r_i = 0$$

where $r_i$ denotes a current bit, and $r_i = LQ_i$.

A process for calculating $LQ_i$ is shown in a formula (5), where $c_i$ denotes an index set of the $i^{th}$ column, and $$\sum_{l \in C_i} Lr_{li}$$

denotes a sum of values of all variable nodes of the $i^{th}$ column.

$$LQ_i = Lc_i + \sum_{l \in C_i} Lr_{li} \quad (5)$$

For example, a total value of variable nodes corresponding to the first column is A1+C1+c1.

Step 108: Determine whether I is equal to Iter.

Further, determine whether I is equal to the maximum quantity of iterations Iter. If a determining result is "Yes" (Y), that is, I=Iter, step 111 is executed, or if a determining result is "No" (N), that is I<Iter, step 109 is executed.

Step 109: I=I+1.

Further, when I is less than Iter, a value of I is increased by 1.

Step 110: Determine whether H*C1 is equal to 0.

Checking is performed according to the codeword $c_1$ resulting from the hard decision and according to the H matrix. If the checking succeeds, that is, H*$c_1$=0, iteration is completed, and step 111 is executed. Otherwise, if H*$c_1$ is not equal to 0, as shown in FIG. 2F, on the basis of each column-updated column of variable nodes, an original input LLR value $Lc_{ji}$ corresponding to the current column is added to obtain an updated variable node value $Lq_{ji}$, as shown in a formula (6).

$$Lq_{ji} = Lc_{ji} + \sum_{l \in C_{j/i}} Lr_{li} \quad (6)$$

After that, step 105 is repeated to start a new iteration.

For example, a value of the first row and the first column is updated as A1+c1 before the next iteration.

Step 111: Take the first K bits in $c_1$ as an output.

Further, after the maximum quantity of iterations is reached or after the checking succeeds, the first K (three) bits are output as a final output result.

Step 112: End.

It can be learned from the above that, in foregoing decoding algorithm, when a bit length N of an LDPC code is relatively large, in logic implementation, a relatively large quantity of memory units are needed to store the check matrix H. A storage requirement is relatively high. Therefore, in LDPC applications, QC-LDPC has become a main type owing to a lower storage requirement.

Further, the check matrix of QC-LDPC depends on two parameters, a base matrix H1 and an inflation factor L. FIG. 3 describes a structure of the base matrix H1, where the inflation factor L=8. Each element in the base matrix represents one phalanx of L*L, where a value of the phalanx depends on a value of the element. According to dimension parameters 4*10 (m=4, n=10) of the base matrix and the inflation factor L=8 in the example, dimensions 32*80 (mL*nL) of an original check matrix H may be obtained, and further basic parameters of LDPC may be obtained, N=80, P=32, and K=48. Values of elements in the base matrix may be classified into two types, −1 and non −1. −1 denotes an L*L zero matrix. A non −1 value, such as k, denotes a matrix that is obtained by cyclically shifting, using a column vector as a unit, an L*L unit matrix rightward for k times. Therefore, 0 denotes an L*L unit matrix, 1 denotes a matrix that is obtained by cyclically shifting, using a column vector as a unit, the unit matrix rightward for once. A value range of K is −1, 0, 1, . . . , and L−1. FIG. 4 describes cases of matrix content represented by k with values of 0, 1, and 2. A case in which k is another value can be obtained by analogy, which is not further described herein.

It can be seen from the descriptions of QC-LDPC, a check matrix H of such type may be denoted by the base matrix H1 and the inflation factor L. In logic implementation, only H1 needs to be stored. In comparison with the usual way for storing an original check matrix H, a storage amount is greatly reduced. Therefore, at present, QC-LDPC is widely applied to many scenarios.

A soft decision decoding method for QC-LDPC is identical to the method shown in FIG. 1, only that each element represents one group of L*L data. Each element of the QC-LDPC base matrix is an L*L zero matrix or unit matrix, or a shift matrix of a unit matrix. Therefore, each element of the base matrix is related to only L fixed pieces of LLR data. In addition, each row or each column has only one 1, that is, each row or each column is related to only one piece of LLR data. For ease of computation, generally, input LLR data is divided into multiple groups, and each group has L pieces of LLR data. The L pieces of LLR data are cyclically shifted according to a value of each element of the base matrix and computation is performed after alignment is achieved.

Based on the foregoing descriptions, it can be learned that if L is relatively large, for example, the DOCSIS 3.1 protocol specifies three bit lengths, where for a long code, L=360, iterative computation needs to be performed on 360 pieces of LLR data. If a bit width of each piece of LLR data is 6 bits, 360*6=2160 bits need to be processed simultaneously. Therefore, LDPC decoding needs to consume many hardware resources and is difficult to meet a timing requirement. If L is relatively small, a quantity of parallel operations is reduced and resources are reduced, which improves timing but decreases decoding traffic.

It can be seen from this, when one LDPC decoder is required to support multiple LDPC bit lengths, for example, the foregoing described three bit lengths, for the long-code L, decoding traffic performance is high, but a large quantity of resources are consumed, for a short-code L, parallel operation and processing performance is relatively low, less than one sixths that for the long code, and does not meet a traffic performance requirement.

The embodiments of the present disclosure provide a decoding method for an LDPC code, which resolves the problem, with the foregoing technology, of inconsistent processing performance for different LDPC bit lengths, where a long code occupies many resources and processing performance for a short code is low. The following provides detailed description with reference to specific examples.

Figure 5:
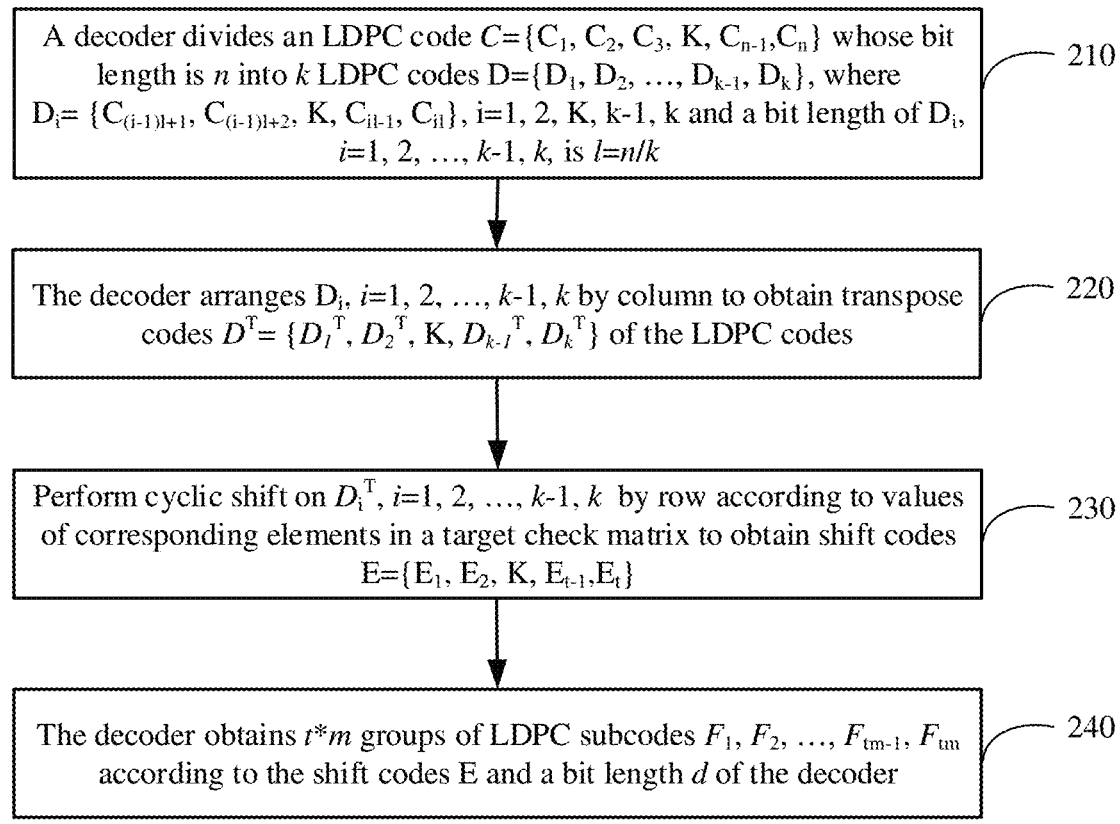
FIG. 5 is a schematic flowchart of a decoding method for an LDPC code according to another embodiment of the present disclosure.

FIG. 5 is a flowchart of a decoding method for an LDPC code according to an embodiment of the present disclosure. The method of FIG. 5 may be executed by a decoder for the LDPC code. The decoder may be located in a receiving device of the LDPC code. For example, the decoder is implemented by a processor in the receiving device or implemented by a dedicated LDPC-code decoder in the receiving device.

Step 210: The decoder divides an LDPC code C={$c_2,c_3$, K,$c_{n-1},c_n$} whose bit length is n into k LDPC codes D={$D_1$, $D_2$,K,$D_{k-1}$,$D_k$}, where $D_i$={$c_{(i-1)l+1}$,$c_{(i-1)l+2}$,K,$c_{il-1}$,$c_{il}$}, i=1, 2,K, k−1, k, and a bit length of $D_i$ is $l=_{n/k}$.

The bit length of an LDPC code refers to a quantity of bits included in the LDPC code. The LDPC code C refers to an original LDPC code that needs to be decoded.

The LDPC code C={$c_1,c_2,c_3$,K,$c_{n-1},c_n$} may be regarded as a sequence. Therefore, the LDPC code can be divided into k segments in a time order of the sequence, a bit length of each segment is l, l bits of each segment form an LDPC code $D_i$, i=1, 2, K, k−1, k in an original order of the l bits.

Using n=1080 as an example, the LDPC code is divided into 3 segments, that is, k=3. In this case, the LDPC code is expressed as D={$D_1,D_2,D_3$}, where $D_1$={$c_1,c_2$,K,$c_{359},c_{360}$}, $D_2$={$c_{361},c_2$,K,$c_{359},c_{720}$}, and $D_3$={$c_{721},c_2$,K,$c_{359},c_{1080}$}. Bit lengths of $D_1$, $D_2$, and $D_3$ are all 360, that is, $D_1$, $D_2$, and $D_3$ each include 360 bits.

Similarly, the LDPC code with n=1080 may alternatively be divided into 6 segments, that is, k=6. The segmented LDPC code may be expressed as D={$D_1,D_2,D_3,D_4,D_5$, $D_6$}={{$c_1,c_2$,K,$c_{179},c_{180}$},{$c_{181},c_{182}$,K,$c_{359},c_{360}$}, {$c_{361},c_{362}$,K, $c_{539},c_{540}$}, {$c_{541},c_{542}$,K,$c_{719},c_{720}$}, {$c_{721},c_{722}$, K,$c_{899},c_{900}$}, {$c_{901}$, $c_{902}$,K,$c_{1079},c_{1080}$}}.

For another n value and/or another k value, the LDPC code D={$D_1,D_2$,K,$D_{k-1}$,$D_k$} may be obtained similarly, which is not further described herein.

Optionally, in one embodiment, the LDPC code may be a QC-LDPC code. When the QC-LDPC code is segmented, the QC-LDPC code may be segmented according to an inflation factor of a base matrix of the QC-LDPC code. Another type of LDPC code may be also processed using a similar segmentation method, which is not further described herein.

It can be understood that each code segment obtained after segmentation may be regarded as one 1*l matrix. Any operation performed on a code segment may be regarded as a corresponding operation on a 1*l matrix.

Step 220: The decoder arranges $D_i$, i=1, 2, K, k−1, k by column to obtain transpose codes $D^T$={$D_1^T,D_2^T$,K,$D_{k-1}^T$, $D_k^T$} of the LDPC codes D, where $D_i^T$={$c_{(i-1)l+1},c_{(i-1)l+2}$, K $c_{il-1},c_{il}$}$^T$, i=1, 2, K, k−1, k.

That the decoder arranges a code segment by column may be regarded as a transpose operation on a 1*l matrix. A result of the operation is one l*1 matrix. This means that a result of the operation on the k segments may be regarded as kl*1 matrixes.

Step 230: Perform cyclic shift on $D_i^T$, i=1, 2, K, k−1, k by row according to values of corresponding elements in a target check matrix to obtain shift codes E={$E_1,E_2$,K,$E_{t-1}$, $E_t$}, where t is equal to a quantity of rows of the target check matrix, and $E_j$ is a result of shifting $D^T$ according to an element of the $j^{th}$ row in the target check matrix, where j=1, 2,K, t−1, t.

The target check matrix refers to a check matrix that is actually stored during logic implementation. For example, if a decoder receives an input of a QC-LDPC code, the target check matrix is a base matrix of the QC-LDPC code. Dimensions of the base matrix are t*k, and dimensions of a corresponding original check matrix are (t*l)*(k*l).

It should be noted that, E={$E_1,E_2$,K,$E_{t-1}$,$E_t$} only denotes that E consists of $E_1$, $E_2$, K, $E_{t-1}$, $E_t$. Actually, $E_j$ may be regarded as a matrix of l*k, and E may be regarded as a matrix of (t*l)*k, which may be expressed as:

$$E = \begin{bmatrix} E_1 \\ E_2 \\ M \\ E_{t-1} \\ E_t \end{bmatrix}$$

Step 240: The decoder obtains t*m groups of LDPC subcodes $F_1$, $F_2$, K, $F_{tm-1}$, $F_{tm}$ according to the shift codes E and a bit length d of the decoder, where $E_j$ is divided into m groups, $E_j$={$(E_j)_1^d,(E_j)_{d+1}^{2d}$,K,$(E_j)_{(m-2)d+1}^{(m-1)d}$, $(E_j)_{(m-1)d+1}^{md}$}={$F_{(j-1)m+1},F_{(j-1)m+2}$,K,$F_{jm-1},F_{jm}$}, $(E_j)_{(s-1)d+1}^{sd}$, s=1, 2, K, m−1, m denotes the [(s−1)d+1]$^{th}$ row to the $(sd)^{th}$ row of $E_j$, m=⌈l/d⌉.

The decoder divides $E_j$ into m equal groups. For example, the decoder divides $E_j$ into 2 groups, that is, m=2. Further, $E_1$ is divided into two groups $F_1$ and $F_2$, $E_2$ is divided into two groups $F_3$ and $F_4$. Similarly this goes on until $E_t$ is divided into two groups $F_{tm-1}$ and $F_{tm}$, where $F_1$=$(E_1)_1^d$, $F_2$=$(E_1)_{d+1}^{2d}$. That is, a matrix formed by the first row to the $d^{th}$ row of $E_1$ is LDPC subcodes of the $F_1$ group, and a matrix formed by the $(d+1)^{th}$ row to the $(2d)^{th}$ row of $E_1$ is LDPC subcodes of the $F_2$ group. The rest is similar, and is not described in detail herein.

It should be noted that, $E_j=\{(E_j)_1^d,(E_j)_{d+1}^{2d},K,(E_j)_{(m-2)d+1}^{(m-1)d},(E_j)_{(m-1)d+1}^{md}\}$ only denotes that $E_j$ consists of $(E_j)_1^d,(E_j)_{d+1}^{2d},K,(E_j)_{(m-2)d+1}^{(m-1)d},(E_j)_{(m-1)d+1}^{md}$. The $E_j$ may be regarded as a form of a matrix, expressed as:

$$E_j = \begin{bmatrix} (E_j)_1^d \\ (E_j)_{d+1}^{2d} \\ M \\ (E_j)_{(m-2)d+1}^{(m-1)d} \\ (E_j)_{(m-1)d+1}^{md} \end{bmatrix}$$

Step 250 (not shown): The decoder decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose/is relatively large can be reduced, and processing performance for an LDPC code whose 1 is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

Alternatively, in another embodiment of the present disclosure, step 220 and step 230 may not be executed.

In this case, when step 220 and step 230 are not executed, the decoder needs to execute the following initialization operation. The decoder obtains LLR values $G=\{G_1,G_2,K,G_{k-1},G,\}$ corresponding to the LDPC code segments, and initializes the target check matrix according to the LLR values to obtain an initialized check matrix $E=\{E_1,E_2,K,E_{t-1},E_t\}$, where t is equal to a quantity of rows of the target check matrix. Then, the decoder performs a grouping operation, that is, dividing the initialized check matrix into groups according to the bit length of the decoder. Further, the decoder obtains the t*m groups of LDPC subcodes shown in step 240 according to an initialized code and the bit length d of the decoder. Finally, the decoder may perform a decoding operation according to step 250.

Optionally, in one embodiment, in step 250, the m groups of LDPC subcodes may be decoded in the manner of obtaining LLR values $G_1$, $G_2$, K, $G_{tm-1}$, $G_{tm}$ corresponding to the LDPC subcodes, updating check nodes according to the LLR values in an order of r=1, 2, K, tm−1, tm to obtain a row-updated matrix, updating variable nodes column by column according to the row-updated matrix to obtain a column-updated matrix, and performing decision and checking on the column-updated matrix to obtain the decoding result of the LDPC code C.

In this way, the decoder in this embodiment of the present disclosure may perform, in a row-update process, a row-update operation on each group of LDPC subcodes, thereby implementing a process in which an LDPC code with a larger bit length is decoded using a decoder with a smaller bit length.

Optionally, in another embodiment, when the decoder decodes the m groups LDPC subcodes, a Min-sum decoding algorithm may be used to decode the m groups LDPC subcodes to obtain the decoding result of the LDPC code C.

The Min-sum decoding algorithm is a commonly-used algorithm for LDPC code decoding, but the present disclosure is not limited to any specific decoding algorithm.

The following describes a decoding process of this embodiment of the present disclosure in detail with reference to a specific example. FIG. 6 to FIG. 9 are schematic diagrams of a decoding process for a QC-LDPC code whose bit length is n=80 using the Min-sum decoding algorithm.

First, the QC-LDPC code $C=\{c_1,c_2,c_3,K,c_{79},c_{80}\}=\{a_1,a_2,a_3,K,a_{79},a_{80}\}$ is divided into 10 segments according to an inflation factor l=8 of the QC-LDPC code, and the code segments obtained thereby may be expressed as:
$D=\{D_1,D_2,D_3,D_4,D_5,D_6,D_7,D_8,D_9,D_{10}\}=\{\{c_1,c_2,K,c_7,c_8\},\{c_9,c_{10},K,c_{15},c_{16}\},\{c_{17},c_{18},K,c_{23},c_{24}\},\{c_{25},c_{26},K,c_{31},c_{32}\},\{c_{33},c_{34},K,c_{39},c_{40}\},\{c_{41},c_{42},K,c_{47},c_{48}\},\{c_{49},c_{50},K,c_{55},c_{56}\},\{c_{57},c_{58},K,c_{63}c_{64}\},\{c_{65},c_{67},K,c_{71},c_{72}\},\{c_{73},c_{74},K,c_{79},c_{80}\}\}$.

Segmenting the QC-LDPC code according to a magnitude of the inflation factor of the QC-LDPC code enables flexible control on a quantity of parallel decoding operations and enables convenient decoding. Therefore, decoding complexity is lowered.

Figure 6:
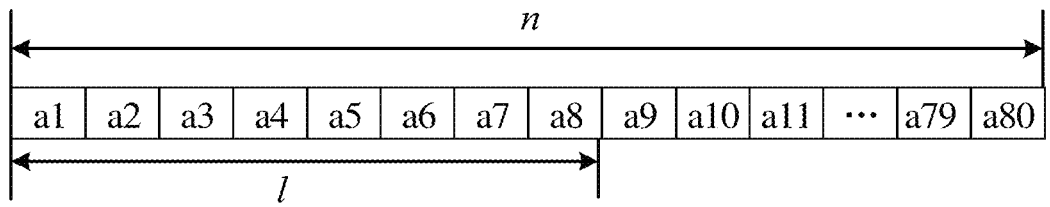
FIG. 6 is a schematic block diagram of a decoding method for an LDPC code according to another embodiment of the present disclosure.

In this embodiment of the present disclosure, the QC-LDPC code C may be regarded as a matrix of 1*80, and each code segment may be regarded as a matrix of 1*8. FIG. 6 is a schematic diagram of segmenting the QC-LDPC code.

It should be noted that, this embodiment of the present disclosure is described using an example in which a base matrix of the QC-LDPC code is the base matrix shown in FIG. 3.

The foregoing code segments are arranged by column to obtain transpose codes as shown in FIG. 7.

Then, the foregoing transpose code is shifted according to the foregoing base matrix shown in FIG. 3 and according to a value of a corresponding element in the base matrix. Values of elements of the first column shown in FIG. 8 are a result of performing cyclic shift by row on elements of the first column of the code segment according to a value 3 of the element of the first row and the first column of the base matrix. Similarly, similar operations are performed on other columns of the code segment. In addition, a matrix shown in FIG. 8 may be obtained by performing a corresponding shift on the transpose code according to elements corresponding to the second row, the third row, and the fourth row in the base matrix.

The shift codes shown in FIG. 8 are divided into groups according to a bit length of the decoder. For example, when the bit length of the decoder is 4, the shift code shown in FIG. 8 are divided into 8 groups, that is, groups $F_1$, $F_2$, $F_3$, $F_4$, $F_5$, $F_6$, $F_7$, and $F_8$ shown in FIG. 8. That is, the QC-LDPC code may be divided into 8 groups of QC-LDPC subcodes.

Using a Min-sum decoding algorithm as an example, decoding is performed in an order of group $F_1$, group $F_2$, group $F_3$, group $F_4$, group $F_5$, group $F_6$, group $F_7$, and group $F_8$ successively. For a specific decoding method, reference may be made to the foregoing decoding method that is described with reference to FIG. 1 and FIG. 2.

Figures 9B, 10:
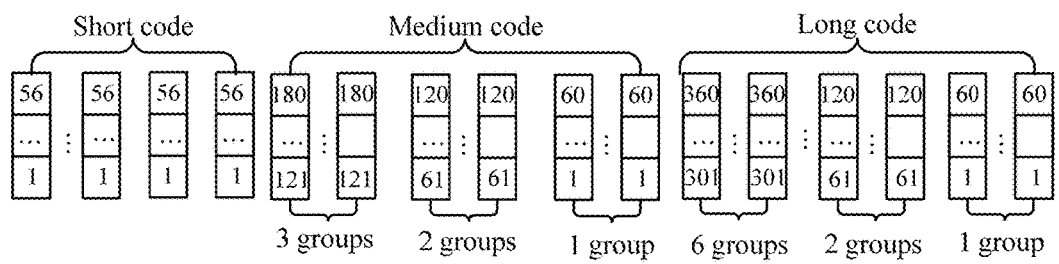

It should be noted that, when row updating is performed, only a row position of a check node needs to be known, and which column the check nodes is located does not need to be known. Therefore, check nodes may be updated by directly using the shift code obtained previously. Using an element 3 of the first row and the first column in the base matrix as an example, the element 3 represents a matrix that is obtained by cyclically shifting an 8*8 unit matrix rightward for 3 times using a column vector as a unit. As shown in FIG. 9A, the matrix is initialized to obtain a matrix shown in FIG. 9B. In this 8*8 matrix, elements of the first row to the fourth row are a4, a5, a6, and a7 successively, and element values of the first four rows of the first column of the shift code shown in FIG. 8 are also a4, a5, a6, and a7 successively. It can be seen that the check nodes can be updated by performing corresponding operations on the shift code.

Further, a 32*10 matrix shown in FIG. 8 may be obtained according to the values of the four rows of elements in the base matrix. When the check nodes are updated, check nodes of the group $F_1$ are updated first, that is, the first four rows of the 32*10 matrix are updated, then check nodes of the group $F_2$ are updated, that is, the fifth row to the eighth row of the 32*10 matrix are updated. Similarly, of the rest groups are row-updated. For a specific processing procedure, reference may be made to step 105. To avoid repetition, details are not described herein again. In this way, all check nodes are updated, and a matrix obtained thereby may be referred to as a row-updated matrix.

Variable nodes are updated according to the row-updated matrix to obtain a column-updated matrix. For a specific processing procedure, reference may be made to step 106. To avoid repetition, details are not described herein again.

A total value of the variable nodes is calculated according to the column-updated matrix, and decision and checking are performed to finally obtain a decoding result. Similarly, for a specific processing procedure, reference may be made to steps 107 to 112. To avoid repetition, details are not described herein again.

Therefore, the solution of this embodiment of the present disclosure is feasible and effective, in which a LDPC code whose bit length is n is divided into multiple LDPC code segments whose bit length is l, the LDPC code segments are arranged by column and are cyclically shifted, and the cyclically shifted LDPC code is divided into groups, and then the code groups are decoded to obtain a decoding result of the LDPC code.

On one hand, in this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose 1 is relatively large can be reduced, and processing performance for an LDPC code whose 1 is relatively small can be enhanced in order to achieve a better balance between decoding performance and resources.

On the other hand, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

Optionally, in another embodiment, d may be 60 or 180.

When d is 60, for example, in DOCSIS 3.1, when a code block received by the decoder includes three (long, medium, and short) bit lengths, that is, when the decoder needs to process three (long, medium, and short) bit lengths. As shown in FIG. 10, a long code may be divided into 6 groups, and each group includes 60 pieces of data, after the 6 groups of data are processed, a row update is completed. A medium code may be divided into 3 groups, and each group includes 60 pieces of data, after the 3 groups of data are processed, a row update is completed. A short code is not divided to groups, but is processed still based on 56 pieces of data, and four pieces of data are wasted. A performance loss is quite small, only 4/60, that is, one fifteenth.

In this way, a maximum quantity of parallel operations supported by one LDPC decoding module is only 60, resources thereof are reduced, and timing is better. Moreover, performance is basically the same for long, medium, and short codes.

When the code block received by the decoder includes only any two bit lengths of long, medium, and short codes, decoding may also be performed in the foregoing method. It should be understood that the three bit lengths in DOCSIS 3.1 are merely used herein as an example. The present disclosure does not limit an LDPC code with any other bit length and any other specific quantity of parallel operations supported, and during specific operations, processing may be performed according to needs and available resources.

In the foregoing example, the quantity of parallel operations supported is only 60. Therefore, processing performance is relatively low. When the processing performance needs to be improved, multiple decoders may be instantiated, in which case, a processing capability is increased by folds. That is, when multiple code blocks received by the decoder include at least two code blocks including LDPC codes with multiple bit lengths, multiple decoders may be used for decoding.

Figure 11:
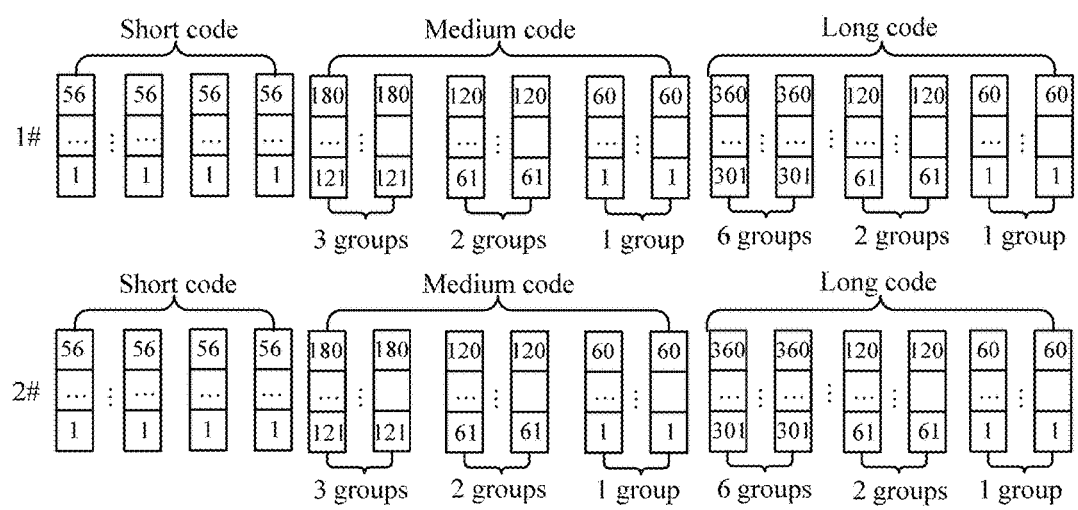
FIG. 11 is a schematic block diagram of a decoding method for an LDPC code according to another embodiment of the present disclosure.

As shown in FIG. 11, when the at least two code blocks received by the decoder each include multiple LDPC codes whose bit length is n, 2 decoders, that is, 1# and 2#, may be instantiated. The quantity of parallel operations supported by the LDPC decoding module may be increased to 120 using two decoders whose bit length is 60 to form one decoder whose bit length is 120. Although resources are increased by one fold, processing performance is also improved by one fold. In this case, performance for the three bit lengths of long, medium, and short codes still maintains basically the same.

Figure 12:
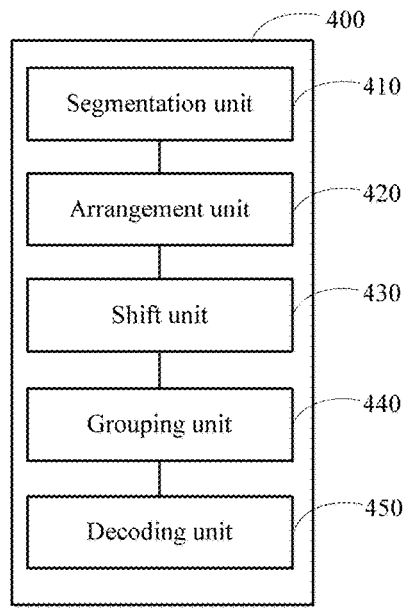
FIG. 12 is a schematic block diagram of a decoder for an LDPC code according to an embodiment of the present disclosure.

FIG. 12 is a block diagram of a decoder 400 for an LDPC code according to an embodiment of the present disclosure. The decoder 400 in FIG. 12 includes a segmentation unit 410, an arrangement unit 420, a shift unit 430, a grouping unit 440, and a decoding unit 450.

Further, the segmentation unit 410 divides an LDPC code $C=\{c_1,c_2,c_3,K,c_n\}$ whose bit length is n into k LDPC codes $D=\{D_1,D_2,K,D_{k-i},D_k\}$, where $D_1=\{c_{(i-1)l+1},c_{(i-1)l+2}, K,c_{il-1},c_{il}\}$, i=1, 2, K, k−1, k and a bit length of $D_i$ is l=n/k. The arrangement unit 420 arranges $D_i$, i=1, 2, K, k−1, k by column to obtain transpose codes $D^T=\{D_1^T,D_2^T,K,D_{k-1}^T, D_k^T\}$ of the LDPC codes D, where $D_i^T=\{c_{(i-1)l+1},c_{(i-1)l+2}, K,c_{il-1},c_{il}\}^T$, i=1, 2, K, k−1, k. The shift unit 430 performs cyclic shift on $D_1^T$, i=1, 2,K, k−1, k by row according to values of corresponding elements in a target check matrix to obtain shift codes $E=\{E_1,E_2,K,E_{t-1},E_t\}$, where t is equal to a quantity of rows of the target check matrix, and E is a result of shifting $D^T$ according to an element of the $j^{th}$ row in the target check matrix, where j=1, 2, K, t−1, t. The grouping unit 440 obtains t*m groups of LDPC subcodes $F_1$, $F_2$, K, $F_{tm-1}$, $F_{tm}$ according to the shift codes E and a bit length d of the decoder, where E is divided into m groups, $E_j$= $\{(E_j)_1{}^d,(E_j)_{d+1}{}^{2d},K,(E_j)_{(m-2)d+1}{}^{(m-1)d},(E_j)_{(m-1)d+1}{}^{md}\}=$ $\{F_{(j-1)m+1},F_{(j-1)m+2},K,F_{jm-1},F_{jm}\}$, $(E_j)_{(s-1)d+1}{}^{sd}$, s=1, 2, K, m−1, m denotes the $[(s-1)d+1]^{th}$ row to the $(sd)^{th}$ row of $E_j$, and m=[l/d]. The decoding unit 450 decodes the m groups of LDPC subcodes to obtain a decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

Alternatively, in another embodiment of the present disclosure, the decoder may not include the segmentation unit 410 and the shift unit 430, but may include an initialization unit. Further, the initialization unit obtains LLR values $G=\{G_1,G_2,K,G_{k-1},G_t\}$ corresponding to the code LDPC segments, and initializes a target check matrix according to the LLR values to obtain an initialized check matrix $E=\{E_1, E_2,K,E_{t-1},E_t\}$, where t is equal to a quantity of rows of the target check matrix. In this case, the grouping unit 440 divides the initialized check matrix into groups according to the bit length of the decoder to obtain t*m groups of LDPC subcodes, and the LDPC subcodes may further be decoded using the decoder in this embodiment of the present disclosure.

Optionally, in one embodiment, the decoding unit 450 is further configured to obtain LLR values $G_1,G_2,K,G_{tm-1},G_{tm}$ corresponding to the LDPC subcodes, update check nodes according to the LLR values in an order of r=1, 2, K, tm−1, tm to obtain a row-updated matrix, and update variable nodes column by column according to the row-updated matrix to obtain a column-updated matrix, and perform decision and checking on the column-updated matrix to obtain the decoding result of the LDPC code C.

It should be noted that the decoder 400 in this embodiment of the present disclosure may be implemented by totally using dedicated hardware, such as a dedicated chip, an integrated circuit, or other firmware, or may be implemented using a general purpose processor and an instruction thereof, where the instruction may be stored in the processor or stored in a separate memory. All these forms fall within the scope of the embodiments of the present disclosure.

Optionally, in another embodiment, the LDPC code C is a QC-LDPC, and l is an inflation factor of the QC-LDPC code.

Optionally, in another embodiment, d is 60 or 180.

Optionally, in another embodiment, the decoding unit 450 uses a Min-sum decoding algorithm to decode the m groups of LDPC subcodes to obtain the decoding result of the LDPC code C.

Figure 13:
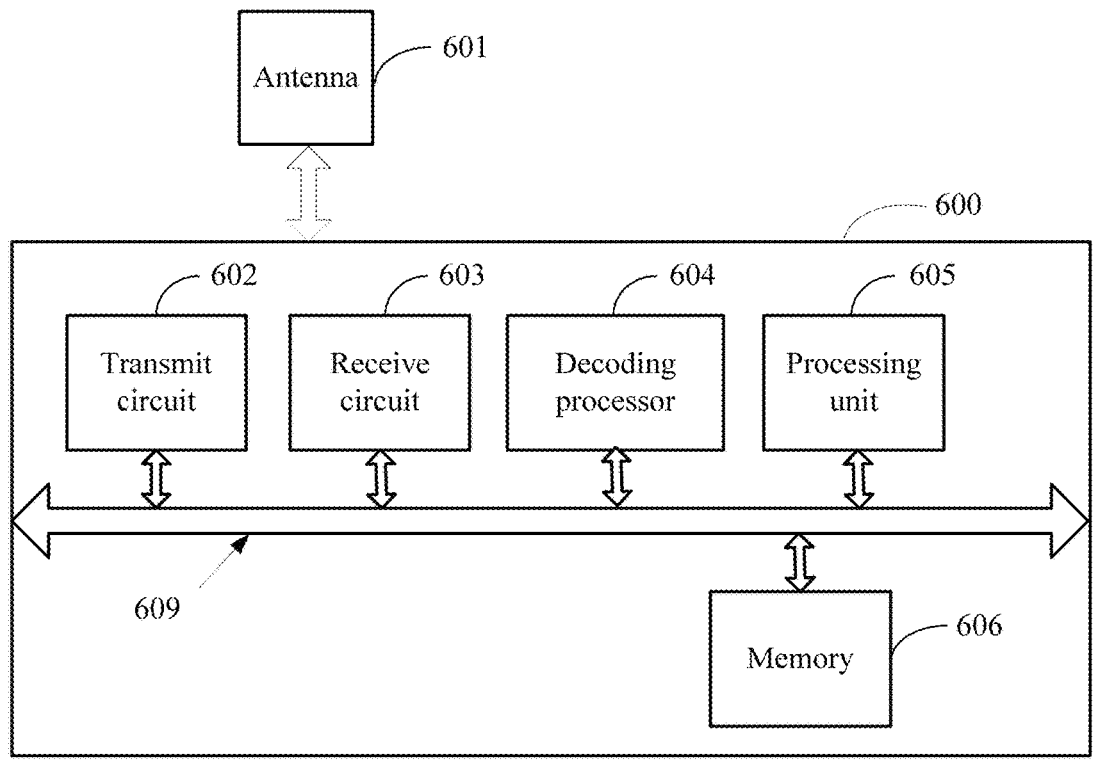
FIG. 13 is a schematic block diagram of a communications device according to an embodiment of the present disclosure.

FIG. 13 is a schematic block diagram of a communications device 600 according to another embodiment of the present disclosure. The communications device 600 in FIG. 13 may be used to implement the steps and methods in the foregoing method embodiments. The communications device 600 may be applied to a base station or a terminal in various communications systems. In the embodiment of FIG. 13, the communications device 600 includes a transmit circuit 602, a receive circuit 603, a decoding processor 604, a processing unit 605, a memory 606, and an antenna 601. The processing unit 605 controls an operation of the communications device 600, and may be used to process a signal. The processing unit 605 may also be referred to as a central processing unit (CPU). The memory 606 may include a read-only memory (ROM) and a random access memory (RAM), and provides an instruction and data to the processing unit 605. A part of the memory 606 may further include a non-volatile RAM (NVRAM). In a specific application, the communications device 600 may be embedded in or itself may be a radio communications device such as a mobile phone, and may further include a carrier that accommodates the transmit circuit 602 and the receive circuit 603 in order to allow the communications apparatus 600 to perform data transmission and reception with a remote location. The transmit circuit 602 and the receive circuit 603 may be coupled to the antenna 601. Components of the communications device 600 are coupled together using a bus system 609. The bus system 609 further includes a power bus, a control bus, and a state signal bus, in addition to a data bus. However, for clear description, various buses are denoted by the bus system 609 in the diagram.

The method disclosed in the foregoing embodiments of the present disclosure may be applied to the decoding processor 604, or implemented by the decoding processor 604. The decoding processor 604 may be an integrated circuit chip with a signal processing capability. In an implementation process, the steps of the foregoing method may be completed by a hardware integrated logical circuit or software-form instructions in the decoding processor 604. These instructions may be implemented via cooperation of the processing unit 605 and control the processing unit 605 to execute the method disclosed in the embodiments of the present disclosure. The decoding processor 604 may be a general purpose processor, a digital signal processor (DSP), an application-specific integrated circuit (ASIC), a field programmable gate array (FPGA) or other programmable logic device, a discrete gate or transistor logic device, or a discrete hardware component, which can implement or execute the methods, steps, and logical block diagrams disclosed in the embodiments of the present disclosure. The general purpose processor may be a microprocessor, or the decoding processor 604 may be any conventional processor or decoder, or the like. The steps of the methods disclosed with reference to the embodiments of the present disclosure may be directly completed by a hardware decoding processor, or may be completed by a combination of hardware and a software module in a decoding processor. The software module may be located in a storage medium that is mature in the art, such as a RAM, a flash memory, a ROM, a programmable ROM (PROM) or an electrically erasable PROM (EEPROM), or a register. The storage medium is located in the memory 606. The decoding processor 604 reads information from the memory 606, and completes the steps of the foregoing methods in combination with the hardware of the processor.

Further, the memory 606 may store an instruction that causes the decoding processor 604 or the processing unit 605 to perform the process of dividing an LDPC code $C=\{c_1,c_2,c_3,K,c_{n-1},c_n\}$ whose bit length is n into k LDPC codes $D=\{D_1,D_2,K,D_{k-1},D_k\}$, where $D_i=\{c_{(i-1)l+1},c_{(i-1)l+2},K,c_{il-1},c_{il}\}$, i=1, 2, K, k−1, k, and a bit length of $D_i$ is l=n/k, arranging $D_i$, i=1, 2, K, k−1, k by column to obtain transpose codes $D^T=\{D_1^T,D_2^T,K,D_{k-1}^T,D_k^T\}$ of the LDPC codes D, where $D_i^T=\{c_{(i-1)l+1},c_{(i-1)l+2},K,c_{il-1},c_{il}\}^T$, i=1, 2, K, k−1, k, performing cyclic shift on $D_i^T$, $D_i^T$i=1, 2, K, k−1, k by row according to values of corresponding elements in a target check matrix to obtain shift codes $E=\{E_1,E_2,K,E_{t-1},E_t\}$, where t is equal to a quantity of rows of the target check matrix, and $E_j$ is a result of shifting $D^T$ according to an element of the $j^{th}$ row in the target check matrix, where j=1, 2,K, t−1, t, obtaining t*m groups of LDPC subcodes $F_1$, $F_2$, K, $F_{tm-1}$, $F_{tm}$ according to the shift codes E and a bit length d of the decoding processor 604, where $E_j$ is divided into m groups, $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},K,F_{jm-1},F_{jm}\}$, $(E_j)_{(s-1)d+1}^{sd}$, s=1, 2, K, m−1, m denotes the $[(s-1)d+1]^{th}$ row to the $(sd)^{th}$ row of $E_j$, m=⌈l/d⌉, and decoding the m groups of LDPC subcodes to obtain the decoding result of the LDPC code C.

In this embodiment of the present disclosure, a cyclically shifted LDPC code can be divided into groups according to a bit length of a decoder, and then the code groups are decoded to obtain a decoding result of the LDPC code. In this way, the bit length of the decoder is not limited to a maximum LDPC code bit length supported by a system such that a quantity of parallel decoding operations on an LDPC code can be controlled flexibly. For example, decoding resources consumed for an LDPC code whose l is relatively large can be reduced, and processing performance for an LDPC code whose l is relatively small can be enhanced in order to achieve a better balance between decoding performance and resources.

In addition, this embodiment of the present disclosure requires only a decoder whose bit length is d so as to reduce resources occupied by individual decoders and lower computation complexity, and therefore can be flexibly applied to scenarios in which resources are limited. Generally, the bit length d of the decoder in this embodiment of the present disclosure is less than 360. Such a decoder bit length is relatively small, and is not necessarily limited to the maximum LDPC code bit length supported by the system, and therefore is more suitable for scenarios in which resources are limited.

The memory 606 may store an instruction that causes the decoding processor 604 or the processing unit 605 to perform corresponding steps of the method 200, which are not repeated herein.

It should be understood that the "one embodiment" or "an embodiment" mentioned throughout the specification means that specific features, structures, or characteristics related to the embodiment are included in at least one embodiment of the present disclosure. Therefore, the "in one embodiment" or "in an embodiment" appearing throughout the entire specification does not necessarily refer to a same embodiment. In addition, these specific features, structures, or characteristics may be incorporated in one or more embodiments in any suitable manner. It should be understood that sequence numbers of the foregoing processes do not mean execution sequences in various embodiments of the present disclosure. The execution sequences of the processes should be determined according to functions and internal logic of the processes, and should not be construed as any limitation on the implementation processes of the embodiments of the present disclosure.

In addition, the terms "system" and "network" may be used interchangeably in this specification. The term "and/or" in this specification describes only an association relationship for describing associated objects and represents that three relationships may exist. For example, A and/or B may represent the following three cases only A exists, both A and B exist, and only B exists. In addition, the character "/" in this specification generally indicates an "or" relationship between the associated objects.

It should be understood that in the embodiments of the present disclosure, "B corresponding to A" indicates that B is associated with A, and B may be determined according to A. However, it should further be understood that determining A according to B does not mean that B is determined according to A only, that is, B may also be determined according to A and/or other information.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

With descriptions of the foregoing embodiments, a person skilled in the art may clearly understand that the present disclosure may be implemented by hardware, firmware or a combination thereof. When the present disclosure is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation The computer-readable medium may include a RAM, a ROM, an EEPROM, a compact disc ROM (CD-ROM), or another optical disc storage or disk storage medium, or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server or another remote source using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk and disc used by the present disclosure includes a compact disc (CD), a laser disc, an optical disc, a digital versatile disc (DVD), a floppy disk, and a BLU-RAY DISC, where the disk generally copies data by a magnetic means, and the disc copies data optically by a laser means. The foregoing combination should also be included in the protection scope of the computer-readable medium.

In summary, what are described above are merely exemplary embodiments of the technical solutions of the present disclosure, but are not intended to limit the protection scope of the present disclosure. Any modification, equivalent replacement, or improvement made without departing from the spirit and principle of the present disclosure shall fall within the protection scope of the present disclosure.

What is claimed is:

1. A decoding method for a low-density parity-check (LDPC) code, comprising:
    dividing, by a decoder, an LDPC code C whose bit length is n into k divided LDPC codes D, the LDPC code $C=\{c_1,c_2,c_3,K,c_{n-1},c_n\}$, the divided LDPC codes $D=\{D_1,D_2,K,D_{k-1},D_k\}$, $D_i=\{c_{(i-1)l+1},c_{(i-1)l+2},K,c_{il-1},c_{il}\}$ $i=1,2,K,k-1,k$, and a bit length of the $D_i$ comprising $l=n/k$;
    arranging, by the decoder, the $D_i$, $i=1,2,K,k-1,k$ by column to obtain transpose codes ($D^T$) of the divided LDPC codes D, the $D^T=\{D_1^T,D_2^T,K,D_{k-1}^T,D_k^T\}$, $D_i^T=\{c_{(i-1)l+1},c_{(i-1)l+2},K,c_{il-1},c_{il}\}^T$, and $i=1,2,K,k-1,k$;
    performing, by the decoder, cyclic shift on the $D_i^T$, $i=1,2,K,k-1,k$ by row according to values of corresponding elements in a target check matrix to obtain shift codes (E), the $E=\{E_1,E_2,K,E_{t-1},E_t\}$, t being equal to a quantity of rows of the target check matrix, $E_j$ comprising a result of shifting the $D^T$ according to an element of a $j^{th}$ row in the target check matrix, and $j=1,2,K,t-1,t$;
    obtaining, by the decoder, t*m groups of LDPC subcodes according to the E and a bit length of the decoder (d), the LDPC subcodes comprising $F_1,F_2,K,F_{tm-1},F_{tm}$, the $E_j$ being divided into m groups, the $E_j=\{(E_j)_1^d, (E_j)_{d+1}^{2d},K,(E_j)_{(m-2)d+1}^{(m-1)d},(E_j)_{(m-1)d+1}^{md}\}=\{F_{(j-1)m+1}, F_{(j-1)m+2},K,F_{jm-1},F_{jm}\}$, $(E_j)_{(s-1)d+1}^{sd}$, $s=1,2,K,m-1,m$ denoting an $[(s-1)d+1]^{th}$ row to an $(sd)^{th}$ row of the $E_j$, and $m=\lceil l/d \rceil$; and
    decoding, by the decoder, m groups of the LDPC subcodes to obtain a decoding result of the LDPC code C such that a quantity of parallel decoding operations on the LDPC code C being controlled flexibly.

2. The method of claim 1, wherein decoding the m groups of the LDPC subcodes to obtain the decoding result of the LDPC code C comprises:
    obtaining, by the decoder, log likelihood ratio (LLR) values corresponding to the LDPC subcodes, the LLR values corresponding to the LDPC subcodes comprising $G_1,G_2,K,G_{tm-1},G_{tm}$;
    updating, by the decoder, check nodes according to the LLR values in an order of $r=1,2,K,tm-1,tm$ to obtain a row-updated matrix;
    updating, by the decoder, variable nodes column by column according to the row-updated matrix to obtain a column-updated matrix; and
    performing, by the decoder, decision and checking on the column-updated matrix to obtain the decoding result of the LDPC code C.

3. The method of claim 1, wherein the LDPC code C comprises a quasi-cyclic LDPC (QC-LDPC) code, and the l comprising an inflation factor of the QC-LDPC code.

4. The method of claim 1, wherein the d comprises sixty.

5. The method of claim 1, wherein decoding the m groups of the LDPC subcodes to obtain the decoding result of the LDPC code C comprises decoding, by the decoder, the m groups of the LDPC subcodes using a minimum sum (Min-sum) decoding algorithm to obtain the decoding result of the LDPC code C.

6. The method of claim 1, wherein the d comprises one hundred eighty.

7. A decoder for a low-density parity-check (LDPC) code, comprising:
    a memory comprising instructions; and
    a processor coupled to the memory, the instructions causing the processor to be configured to:
        divide an LDPC code C whose bit length is n into k divided LDPC codes D, the LDPC code $C=\{c_1,c_2,c_3,K,c_{n-1},c_n\}$, the divided LDPC codes $D=\{D_1,D_2,K,D_{k-1},D_k\}$, $D_i=\{c_{(i-1)l+1},c_{(i-1)l+2},K,c_{il-1},c_{il}\}$, $i=1,2,K,k-1,k$, and a bit length of the $D_i$ comprising $l=n/k$;
        arrange the $D_i$, $i=1,2,K,k-1,k$ by column to obtain transpose codes ($D^T$) of the divided LDPC codes D, the $D^T=\{D_1^T,D_2^T,K,D_{k-1}^T,D_k^T\}$, $D_i^T=\{c_{(i-1)l+1},c_{(i-1)l+2},K,c_{il-1},c_{il}\}^T$, and $i=1,2,K,k-1,k$;
        perform cyclic shift on the $D_i^T$, $i=1,2,K,k-1,k$ by row according to values of corresponding elements in a target check matrix to obtain shift codes (E), the $E=\{E_1,E_2,K,E_{t-1},E_t\}$, t being equal to a quantity of rows of the target check matrix, and $E_j$ comprising a result of shifting the $D^T$ according to an element of a $j^{th}$ row in the target check matrix, and $j=1,2,K,t-1,t$;
        obtain t*m groups of LDPC subcodes according to the E and a bit length of the decoder (d), the $E_j$ being divided into m groups, the $E_j=\{(E_j)_1^d,(E_j)_{d+1}^{2d},K,(E_j)_{(m-2)d+1}^{(m-1)d},(E_j)_{(m-1)d+1}^{md}\}=\{F_{(j-1)m+1},F_{(j-1)m+2},$ K,$F_{jm-1},F_{jm}$}, $(E_j)_{(s-1)d+1}^{sd}$, s=1,2,K, m−1,m denoting an $[(s-1)d+1]^{th}$ row to an $(sd)^{th}$ row of the $E_j$, and m=⌈l/d⌉; and decode m groups of the LDPC subcodes to obtain a decoding result of the LDPC code C such that a quantity of parallel decoding operations on the LDPC code C being controlled flexibly.

8. The decoder of claim 7, wherein the instructions further cause the processor to be configured to:

obtain log likelihood ratio (LLR) values corresponding to the LDPC subcodes, the LLR values corresponding to the LDPC subcodes comprising $G_1,G_2,K,G_{tm-1},G_{tm}$;

update check nodes according to the LLR values in an order of r=1,2,K,tm−1,tm to obtain a row-updated matrix;

update variable nodes column by column according to the row-updated matrix to obtain a column-updated matrix; and perform decision and checking on the column-updated matrix to obtain the decoding result of the LDPC code C.

9. The decoder of claim 7, wherein the LDPC code C comprises a quasi-cyclic LDPC (QC-LDPC) code, and the l comprising an inflation factor of the QC-LDPC code.

10. The decoder of claim 7, wherein the d comprises sixty.

11. The decoder of claim 7, wherein the instructions further cause the processor to be configured to decode the m groups of the LDPC subcodes using a minimum sum (Min-sum) decoding algorithm to obtain the decoding result of the LDPC code C.

12. The decoder of claim 7, wherein the d comprises one hundred eighty.

13. A computer program product comprising a non-transitory computer readable storage medium storing program code thereon for decoding a low-density parity-check (LDPC) code, the program code comprising instructions for executing a method that comprises:

dividing, by a decoder, an LDPC code C whose bit length is n into k divided LDPC codes D, the LDPC code C={$c_1,c_2,c_3,K,c_{n-1},c_n$}, the divided LDPC codes D={$D_1,D_2,K,D_{k-1},D_k$}, $D_i$={$c_{(i-1)l+1},c_{(i-1)l+2},K,c_{il-1},c_{il}$}, i=1,2,K,k−1,k, and a bit length of the $D_i$ comprising l=n/k;

arranging, by the decoder, the $D_i$,i=1,2,K,k−1,k by column to obtain transpose codes ($D^T$) of the divided LDPC codes D, the $D^T$={$D_1^T,D_2^T,K,D_{k-1}^T,D_k^T$}, $D_i^T$={$c_{(i-1)l+1},c_{(i-1)l+2},K,c_{il-1},c_{il}$}$^T$,i=1,2,K,k−1,k;

performing, by the decoder, cyclic shift on the $D_i^T$i=1, 2K,k−1,k by row according to values of corresponding elements in a target check matrix to obtain shift codes (E), the E={$E_1,E_2,K,E_{t-1},t$}, t being equal to a quantity of rows of the target check matrix, $E_j$ comprising a result of shifting the $D^T$ according to an element of a $j^{th}$ row in the target check matrix, and j=1,2,K,t−1,t;

obtaining, by the decoder, t*m groups of LDPC subcodes according to the E and a bit length of the decoder (d), the LDPC subcodes comprising $F_1,F_2,K,F_{tm-1},F_{tm}$, the $E_j$ being divided into m groups, the $E_j$={$(E_j)_1^d$, $(E_j)_{d+1}^{2d}$,K,$(E_j)_{(m-2)d+1}^{(m-1)d}$,$(E_j)_{(m-1)d+1}^{md}$}={$F_{(j-1)m+1}$, $F_{(j-1)m+2}$,K,$F_{jm-1},F_{jm}$}, $(E_j)_{(s-1)d+1}^{sd}$, s=1,2,K,m−1,m denoting an $[(s-1)d+1]^{th}$ row to an $(sd)^{th}$ row of the $E_j$, and m=⌈l/d⌉; and decoding, by the decoder, m groups of the LDPC subcodes to obtain a decoding result of the LDPC code C such that a quantity of parallel decoding operations on the LDPC code C being controlled flexibly.

14. The computer program product of claim 13, wherein decoding the in groups of the LDPC subcodes to obtain the decoding result of the LDPC code C comprises:

obtaining, by the decoder, log likelihood ratio (LLR) values corresponding to the LDPC subcodes, the LLR values corresponding to the LDPC subcodes comprising $G_1,G_2,K,G_{tm-1},G_{tm}$;

updating, by the decoder, check nodes according to the LLR values in an order of r=1,2,K,tm−1,tm to obtain a row-updated matrix;

updating, by the decoder, variable nodes column by column according to the row-updated matrix to obtain a column-updated matrix; and performing, by the decoder, decision and checking on the column-updated matrix to obtain the decoding result of the LDPC code C.

15. The computer program product of claim 13, wherein the LDPC code C comprises a quasi-cyclic LDPC (QC-LDPC) code, and the l comprising an inflation factor of the QC-LDPC code.

16. The computer program product of claim 13, wherein the d comprises sixty.

17. The computer program product of claim 13, wherein the d comprises one hundred eighty.

18. The computer program product of claim 13, wherein decoding the m groups of the LDPC subcodes to obtain the decoding result of the LDPC code C comprises decoding, by the decoder, the m groups of the LDPC subcodes using a minimum sum (Min-sum) decoding algorithm to obtain the decoding result of the LDPC code C.

* * * * *